United States Patent
Hess et al.

(10) Patent No.: US 9,286,971 B1
(45) Date of Patent: Mar. 15, 2016

(54) METHOD AND CIRCUITS FOR LOW LATENCY INITIALIZATION OF STATIC RANDOM ACCESS MEMORY

(71) Applicant: Apple Inc., Cupertino, CA (US)

(72) Inventors: Greg M. Hess, Mountain View, CA (US); Ramesh Arvapalli, Santa Clara, CA (US); Andrew L. Arengo, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/482,613

(22) Filed: Sep. 10, 2014

(51) Int. Cl.
*G11C 11/00* (2006.01)
*G11C 7/00* (2006.01)
*G11C 8/00* (2006.01)
*G11C 11/419* (2006.01)

(52) U.S. Cl.
CPC ..................... *G11C 11/419* (2013.01)

(58) Field of Classification Search
USPC ............... 365/154, 156, 189.11, 203, 230.03
See application file for complete search history.

(56) References Cited

U.S. PATENT DOCUMENTS

| 5,285,420 | A | 2/1994 | Shibue |
| 7,248,519 | B2 | 7/2007 | Kim |
| 7,292,495 | B1 * | 11/2007 | Kenkare ................ G11C 5/147 365/203 |
| 8,488,396 | B2 | 7/2013 | Lee et al. |
| 8,848,463 | B2 * | 9/2014 | Campbell .............. G11C 5/143 365/189.11 |
| 8,976,607 | B2 * | 3/2015 | Desai ................... G11C 7/1096 365/189.11 |
| 2014/0063920 | A1 | 3/2014 | Knickerbocker |
| 2014/0195715 | A1 | 7/2014 | Kim et al. |

* cited by examiner

*Primary Examiner* — Trong Phan
(74) *Attorney, Agent, or Firm* — Meyertons, Hood, Kivlin, Kowert & Goetzel, P.C.; Erik A. Heter

(57) ABSTRACT

A method and various circuit embodiments for low latency initialization of an SRAM are disclosed. In one embodiment, an IC includes an SRAM coupled to at least one functional circuit block. The SRAM includes a number of storage location arranged in rows and columns. The functional circuit block and the SRAM may be in different power domains. Upon initially powering up or a restoration of power, the functional circuit block may assert an initialization signal to begin an initialization process. Responsive to the initialization signal, level shifters may force assertion of various select/enable signals in a decoder associated with the SRAM. Thereafter, initialization data may be written to the SRAM. Writing initialization data may be performed on a row-by-row basis, with all columns in a row being written to substantially simultaneously.

20 Claims, 6 Drawing Sheets

US 9,286,971 B1

METHOD AND CIRCUITS FOR LOW LATENCY INITIALIZATION OF STATIC RANDOM ACCESS MEMORY

BACKGROUND

1. Technical Field

This disclosure is directed to integrated circuits (ICs) and more particularly, to circuitry used in conjunction with static random access memories (SRAMs) and operation of the same.

2. Description of the Related Art

Static random access memories (SRAMs) are widely used in integrated circuits (ICs). Applications of SRAM in ICs includes caches, register files, buffers, and so forth. Advantages of SRAM include a higher density than flip-flops along, faster speeds than dynamic random access memories (DRAMs), while not requiring the refresh cycles used to maintain information in a DRAM.

When a unit including an SRAM is first powered on (either initially or when returning to an active state from a sleep state), the SRAM may be initialized. Initialization of an SRAM may include writing predetermined data to each address therein. For example, during the initialization, a functional circuit block may write all logic 0's to each address in a correspondingly coupled SRAM. The data may be written into the addresses sequentially (i.e. one address after another) until data has been written into all addresses of the SRAM. Thereafter, normal operations utilizing the SRAM may commence.

SUMMARY

A method and various circuit embodiments for low latency initialization of an SRAM are disclosed. In one embodiment, an IC includes an SRAM coupled to at least one functional circuit block. The SRAM includes a number of storage locations arranged in rows and columns. The functional circuit block and the SRAM may be in different power domains. Upon initially powering up or a restoration of power, the functional circuit block may assert an initialization signal to begin an initialization process. Responsive to the initialization signal, level shifters may force assertion of various select/enable signals in a decoder associated with the SRAM. Thereafter, initialization data may be written to the SRAM. Writing initialization data may be performed on a row-by-row basis, with all columns in a row being written to substantially simultaneously.

In one embodiment, an SRAM may include a number of banks, and each row of the SRAM may extend across the number of banks. On a given row within each bank one or more storage locations may be implemented, with each of the storage locations having a number of bits. During the writing of initialization data, all banks and all storage locations within a given row are written to concurrently.

At least some of the level shifters used to convey signals from the functional circuit block to the may be coupled to receive the initialization signal. Responsive to receiving the initialization signal, these level shifters may drive their respective output nodes to a predetermined logic level, irrespective of any other inputs. The outputs of these level shifters may then force the decoder of the SRAM to allow a number of storage locations within a given row to be written to concurrently.

Bit line hold circuits associated with bit cells each include extra hold circuitry to hold the initialization data during the initialization. Each bit line hold circuit may be coupled to a column of bit cells that extends through the rows of the SRAM.

BRIEF DESCRIPTION OF THE DRAWINGS

The following detailed description makes reference to the accompanying drawings, which are now briefly described.

Figure 1:
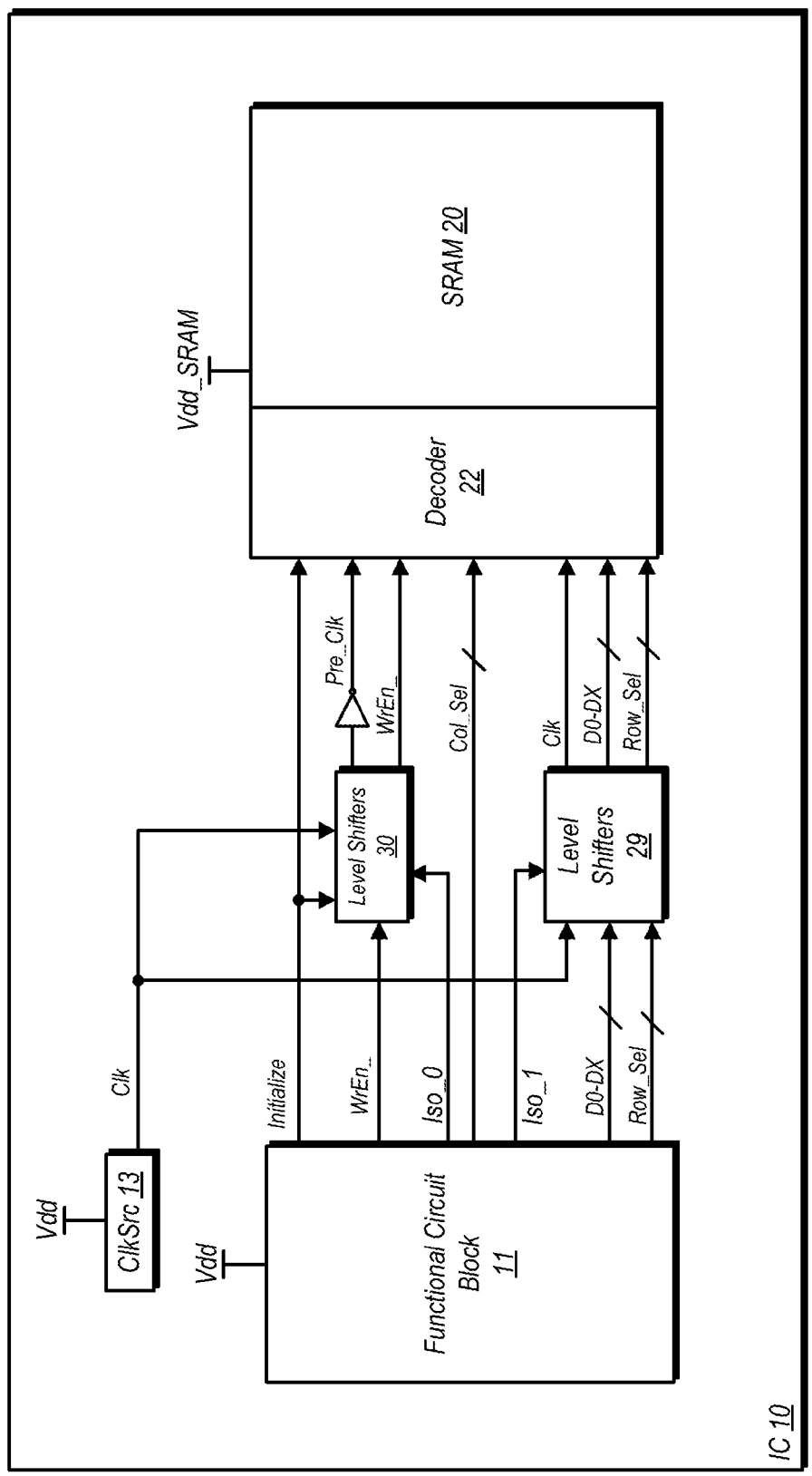
FIG. 1 is a block diagram illustrating one embodiment of an IC having a functional circuit block and an SRAM.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Turning now to FIG. 1, a block diagram of one embodiment of an IC. The embodiment of IC 10 shown here is an exemplary embodiment and is not intended to cover all possible embodiments of an IC falling within the scope of this disclosure. Rather, IC 10 is shown here for illustrative purposes and thus represents only one of many possible IC embodiments according to the principles and scope of the disclosure as discussed below.

IC 10 as shown in FIG. 1 includes a functional circuit block 11 and an SRAM 20. The SRAM 20 may provide storage for data used by functional circuit block 11 during operation. For example, SRAM 20 may be a cache memory, while functional circuit block 11 may be a processor core configured to access the cache and write back data thereto. It is noted that for the sake of simplicity that not all connections between SRAM 20 and functional circuit block 11 are shown. For example, no path for reading data from SRAM 20 by functional circuit block 11 is shown, although it is to be understood that at least one such path is present.

SRAM 20 is coupled to a corresponding decoder 22, which is configured to decode read and write addresses, provide write and read enable signals during write and read operations, respectively, and so on.

In the embodiment shown, functional circuit block 11 is configured to convey various signals and data to SRAM 20 for performing writes thereto. Among these signals are a write enable signal (WrEn), column select signals (Col_Sel), row select signals (Row_Sel), and data bits (D0-DX), where the width of the data bus is an integer value X+1.

Functional circuit block 11 and SRAM 20 (in conjunction with decoder 22) are in different power domains and thus receive different supply voltages in the illustrated embodiment. More particularly, functional circuit block 11 is coupled to receive voltage Vdd, while SRAM 20 and decoder 22 are coupled to receive Vdd_SRAM. Accordingly, level shifters are placed between functional circuit block 11 and decoder 22/SRAM 20. In this particular example, a first group of level shifters 29 and a second group of level shifters 30 are coupled between functional circuit block 11 and decoder 22/SRAM 20. Both groups of level shifters in the embodiment shown are coupled to receive a respective isolation signal (Iso_0, Iso_1) from functional circuit block 11. The isolation signals may be used to effectively isolate data SRAM 20 from functional circuit block 11 such that data stored in the former is not disturbed. Additionally, both groups of level shifters 29 and 30 are coupled to receive a clock signal Clk from a clock source (ClkSrc) 13 that is in the Vdd power domain. One of the level shifters 29 outputs a level shifted version of the clock signal to decoder 22. Meanwhile, one of the level shifters 30 outputs the level shifted clock signal as a precharge clock signal, Pre_Clk. In the embodiment shown, the low phase of the clock cycle may be used as an input signal to the gate terminals of pre-charge transistors, implemented using p-channel metal oxide semiconductor (PMOS) devices, for performing a precharge of the bit lines during normal read and write operations.

Upon initial powering up of IC 10, or when restoring power to SRAM 20 and decoder 22 (e.g., when exiting a power-gated sleep mode), an initialization procedure may be performed. The initialization procedure may be performed by writing predetermined data to each storage location within SRAM 20. For example, SRAM 20 may be initialized by writing logic 0's to each bit cell of each storage location within SRAM 20.

Functional circuit block 11 may assert and hold an initialization signal (Initialize) during the initialization procedure. In this embodiment, the isolation signal Iso_0 may also be held asserted during the initialization procedure. The asserted initialization and Iso_0 signals may be received by level shifters 30. Responsive to receiving these signals, level shifters 30 may drive the enable signal to a predetermined logic level opposite of that when the isolation signal alone is asserted. For example, if the isolation signal Iso_0 causes the level shifters 30 to drive their respective outputs high (or to logic 1), assertion of the initialization concurrent with assertion of Iso_0) may cause level shifters 30 to drive their respective outputs low (or to logic 0). This may cause the write enable signal to be asserted (since it is an active low signal). In addition, a precharge clock (Pre_Clk) may be held to a predetermined level (e.g., high, or logic 1) during the initialization procedure. Since toggling of the precharge clock may be used to effect precharging, holding the precharge clock high may inhibit precharging of bit lines is performed during the writing of initialization data during the initialization procedure. Decoder 22 may also receive the initialization signal and responsive thereto, force all column select signals to their asserted level. In an alternate embodiment, functional circuit block 11 could force assertion of all the column select signals. In either case, all column select signals may be asserted such that all columns (or banks, depending on the arrangement of SRAM 20) are concurrently enabled for writing.

Holding as asserted the write enable signal and each column select signal may allow for significantly faster initialization of SRAM 20. More particularly, holding the signals in these state may allow each storage location within a given row to be written substantially simultaneously. Thus, instead of the number of write cycles being equal to the number of storage locations in SRAM 20, or the number of rows multiplied by the number of columns, the number of write cycles in the various embodiments discussed herein may be equal to the number of rows. This may represent a substantial reduction in the time spent performing the initialization. Moreover, significant dynamic power savings may be achieved by preventing toggling of the precharge clock and thus inhibiting the occurrence of precharging.

Figure 2:
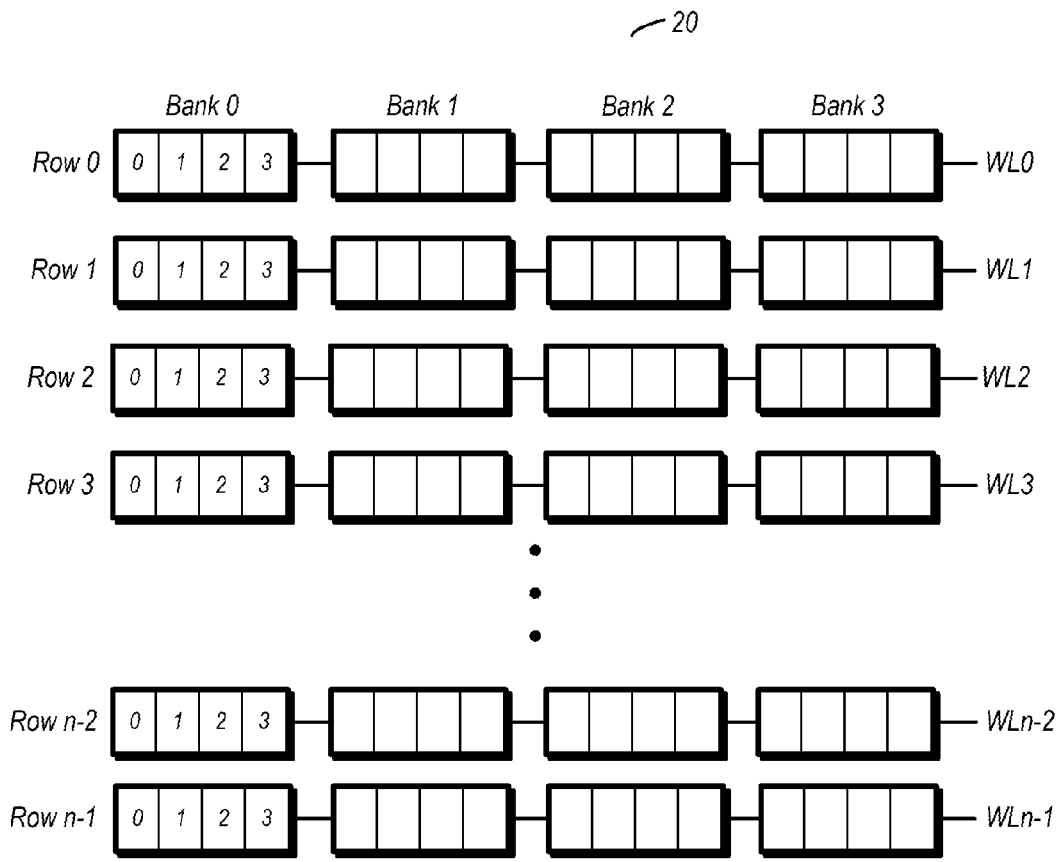
FIG. 2 is a block diagram illustrating one embodiment of an SRAM.
Figure 2:
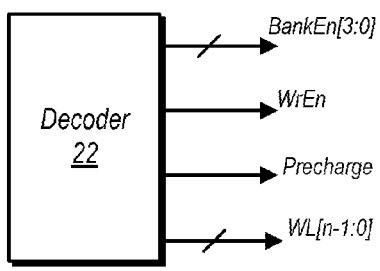

FIG. 2 is a block diagram illustrating one embodiment of SRAM 20. It is noted that the size and organization of an SRAM may vary from this particular example while still falling within the scope of this disclosure.

In this particular example, SRAM 20 includes four banks (Bank 0, Bank 1, Bank 2, and Bank 3) and n rows. In one embodiment, n=64, although this number may vary. Within each bank in a given row, there are four storage locations (addresses 0, 1, 2, and 3), although this number may also vary. During the initialization procedure, decoder 22 may assert bank enable signals (BankEn[3:0]) for each bank based on the signals output from level shifters 30 shown in FIG. 1. Furthermore, if the individual storage locations are independently selectable, then enable signals (not shown) may be asserted for each of these as well. Decoder 22 may also assert a write enable signal, while the precharge (Precharge) signal may be inhibited due to the precharge clock being held in a predetermined state. The writing of initialization data may be performed with decoder 22 asserting the word line signals (WL[n−1:0]) one by one. When a given word line signal is asserted, initialization data may be concurrently written to each storage location of each bank within that row of SRAM 20. In one embodiment, decoder 22 may assert the word line signals sequentially beginning with word line 0 (WL0) and ending with the final word line, WLn−1. If n=64 in the example shown, then the concurrent writing to each storage location in a given row results in the initialization procedure consuming 64 write cycles. In contrast, were the same embodiment to be initialized on a location-by-location basis, 1024 write cycles would be consumed.

Figure 3:
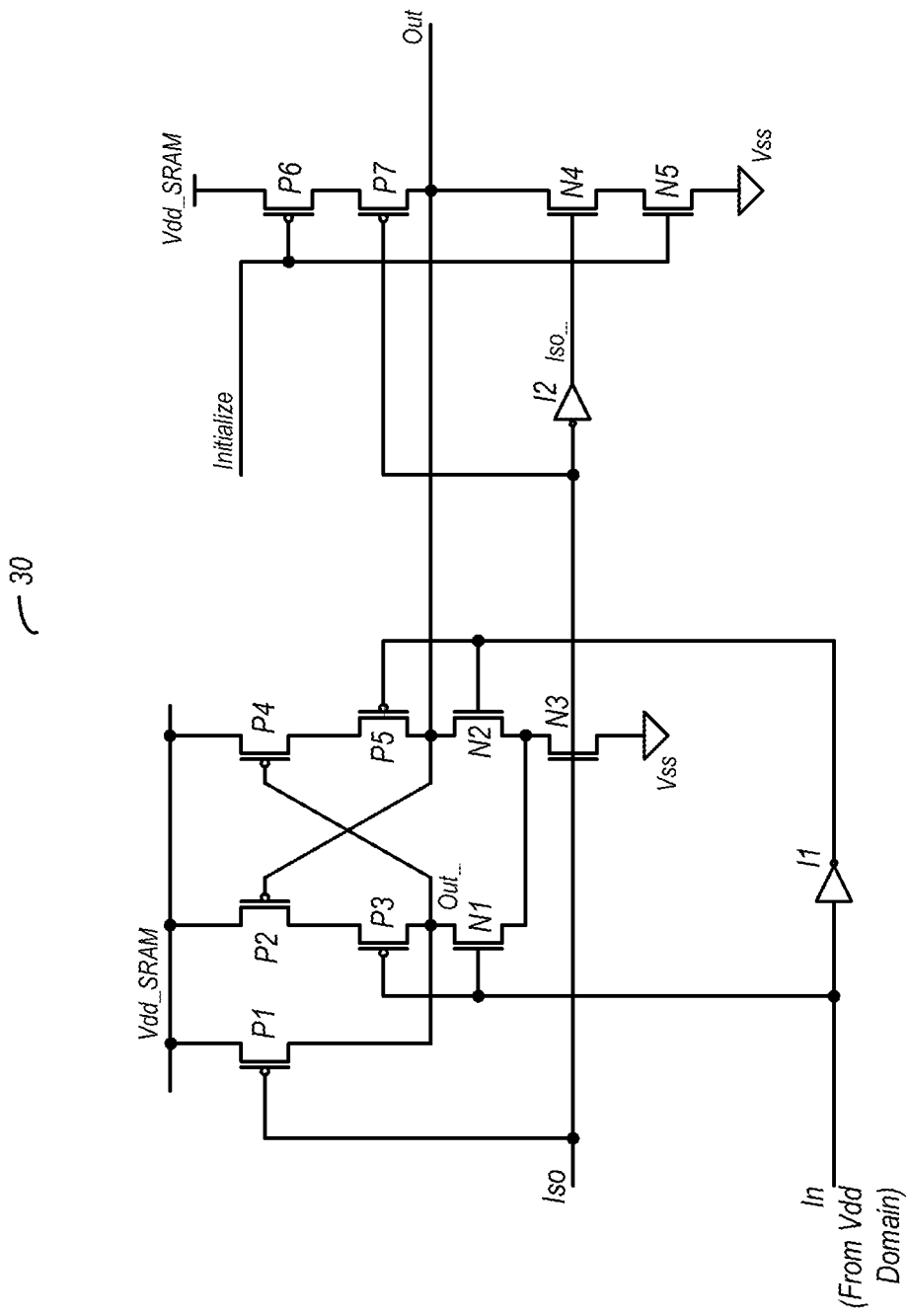
FIG. 3 is a schematic diagram of one embodiment of a level shifter circuit.

Turning now to FIG. 3, one embodiment of a level shifter 30 is shown. In the embodiment shown, level shifter 30 includes a pull-up circuit and a pull-down circuit coupled to the output node, Out. The pull-up circuit includes PMOS devices P6 and P7. The pull-down circuit includes n-channel metal oxide semiconductor (NMOS) devices N4 and N5. The arrangement of the pull-up and pull-down circuits relative to the signal inputs results in a priority for controlling the output signal. Moreover, when the initialization signal (active high in this embodiment) is asserted concurrent with assertion of the isolation signal (active low in this embodiment), the output node is pulled low in this embodiment (which concurs with the assertion levels of the bank select and write enable signals). In particular, assertion of the initialization signal activates transistor N5 while causing P6 to be inactive. Assertion of the active low isolation signal causes activation of both P7 and N4 (the latter being activated due to a high received on the Iso node from inverter I2). With P6 inactive, no pull-up path is present from the output node. However, with both N4 and N5 active, a pull-down path exists between the output node and the reference node, Vss. Accordingly, the output node is pulled low.

When the initialization signal is de-asserted concurrent with assertion of the isolation signal, N5 is inactive while P6 is activated. Thus, the pull-down path is blocked due to the inactive N5, while a pull-up path exists between the output nod and Vdd_SRAM through P6 and P7. Accordingly, assertion of the isolation signal results in the output node being pulled high. Assertion of the isolation signal also activates transistor P1. This in turn provides a pull-up path between Out_ and Vdd_SRAM, and thereby inhibits activation of P4.

When neither the isolation (Iso) or initialization (Initialize) signals are asserted, level shifter 30 may perform its normal level shifting functions. Signals to be level shifted may be received from one power domain (e.g., the Vdd power domain) on the input, In (received from the Vdd power domain in this embodiment). When the isolation signal, Iso, is de-asserted (i.e., high in this embodiment), transistor N3 is active while P1 is inactive. Accordingly, with both the isolation and initialization signals de-asserted, a pull-down path will exist either through N1 and N3 or N2 and N3, depending on the input signal. If the input signal is high, transistor N1 is activated while inverter I1 outputs a low that is received on P5, thereby activating that device. Accordingly the Out_ node is pulled low through N1 and N3, while the output node is pulled toward VDD_SRAM through P5 and P4. If the input signal is low, P3 is active while N2 is activated via the output if I1. Accordingly, the output node is pulled low through N2 and N3, while the Out_ node is pulled toward Vdd_SRAM through P2 and P3.

Figure 4:
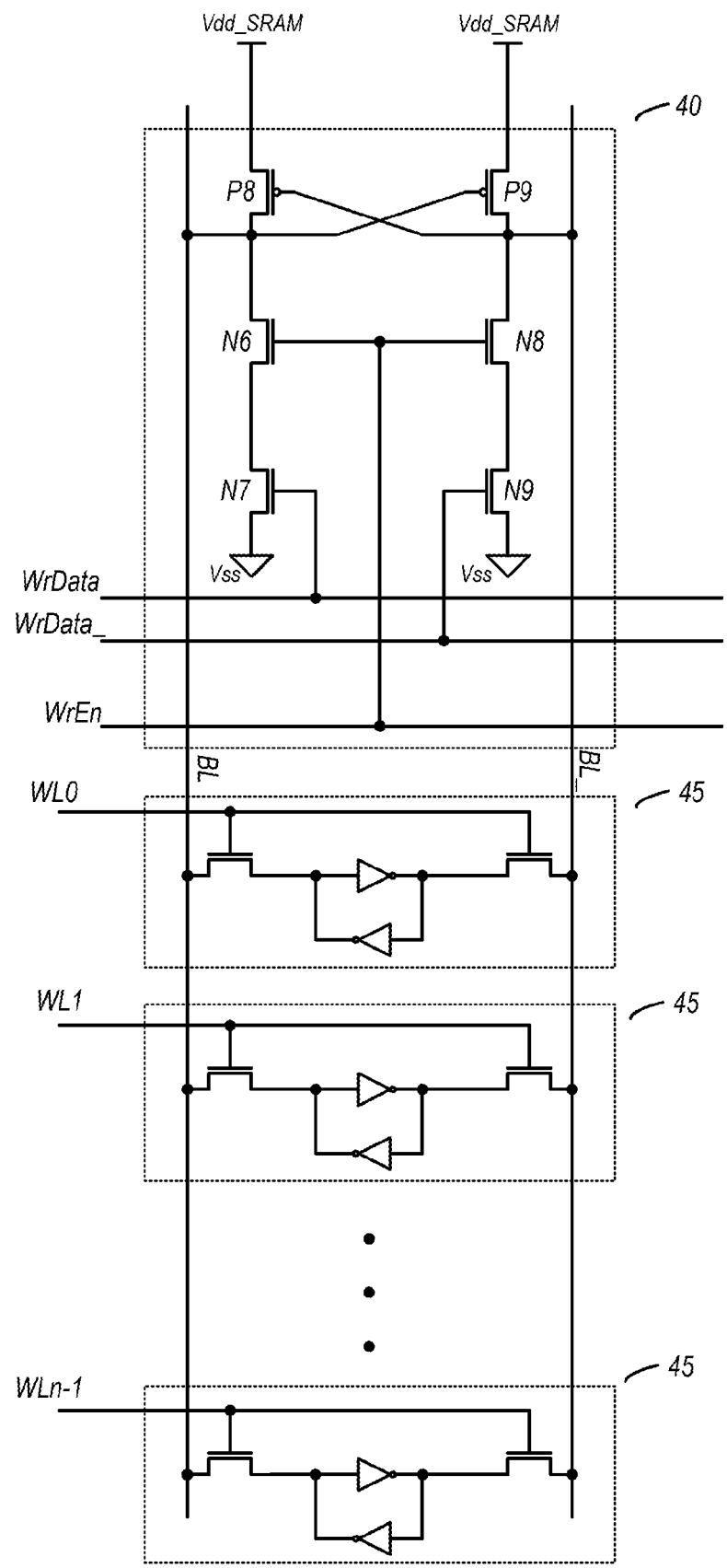
FIG. 4 is a schematic diagram illustrating one embodiment of a bit line hold circuit coupled to a number of bit cells.

FIG. 4 is a schematic diagram illustrating one embodiment of a bit line hold circuit coupled to a number of bit cells. In the embodiment shown, bit line hold circuit 40 is coupled to a number of bit cells 45, one in each row. In various embodiments of an SRAM 20, one bit line hold circuit is implemented for each column of bit cells 45. In this particular example, each bit cell is a standard 6T bit cell, including a pair of cross-coupled inverters to store the data and NMOS transistors for coupling the inverters to respective bit lines, BL and BL_. Data may be conveyed to the inverters of a bit cell 45 by asserting the corresponding word line and thus activating the corresponding NMOS transistors. When the corresponding word line is inactive, the cross-coupled inverters may hold the data.

Bit line hold circuit 40 is configured to convey data onto the bit lines, and further configured to hold data on the bit lines. The circuit includes two pull-down circuits. A first of these pull-down circuits is implemented by transistors N6 and N7, while a second of these circuits is implemented by transistors N8 and N9. Conveying data to the bit lines may be performed by asserting the write enable signal (which is output as high from decoder 22). Assertion of the write enable signal activates both transistors N6 and N7. Data to be conveyed onto the bit line is received on the node WrData and WrData_, which are complements of one another. Accordingly, the received data will activate either N7 or N9, while the other one of these devices will remain in active. The active pull-down path will cause its correspondingly coupled bit line to be pulled low, while the other bit line will remain high.

In the embodiment shown, bit line hold circuit also includes a pair of cross-coupled PMOS transistors P8 and P9. During the conveying of data from the WrData and WrData_ lines to the bit lines, one of these devices may be activated to pull its correspondingly coupled bit line high. The other one of these devices may remain inactive until the state of the data conveyed thereto changes. The presence of P8 and P9 may compensate for leakage and other noise sources during the pre-charge free writing of initialization data to the bit cells 45 of SRAM 20.

Figure 5:
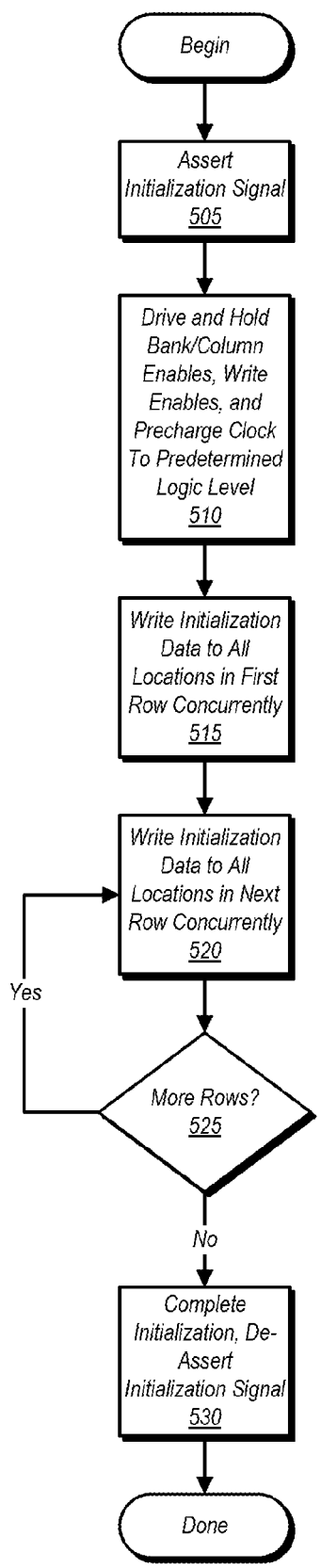
FIG. 5 is a flow diagram illustrating one embodiment of a method for performing an initialization of an SRAM.

FIG. 5 is a flow diagram illustrating one embodiment of a method for performing an initialization of an SRAM. Method 500 as shown herein may be performed by various embodiments of the circuitry/hardware discussed above. Other embodiments of circuitry/hardware capable of performing various embodiments of method 500 (or on which the method may be performed) are also possible and contemplated.

Method 500 begins with the assertion of an initialization signal (block 505). The initialization signal may be asserted by a functional circuit block or other circuitry tasked with initiating and performing the initialization of the SRAM. Responsive to assertion of the initialization signal, various signals such as bank/column select signals, write enables, and precharge clock signals may be driven and held at predetermined levels (block 510). This may have the effect of write enabling all columns and all banks (if bank organization is present) in the SRAM. With all columns/banks write enabled, initialization data may then be concurrently written to all storage locations in a first row of the SRAM (block 515). In an SRAM organized into banks, this may include writing initialization data to all storage locations in each of the banks within that given row. If there are no more rows With the initialization written to the first row, a subsequent write of initialization data is performed on all locations in a next row of the SRAM (block 520). If there are additional rows to which initialization data is to be written (block 525, yes), then the method returns to block 520. This loop may be repeated as many times as necessary until initialization data has been written to all locations in each row of the SRAM. If there are no more rows to which initialization data is to be written (block 525, no), then initialization may be complete and the initialization signal may be de-asserted (block 530). Thereafter, method 500 is complete.

Figure 6:
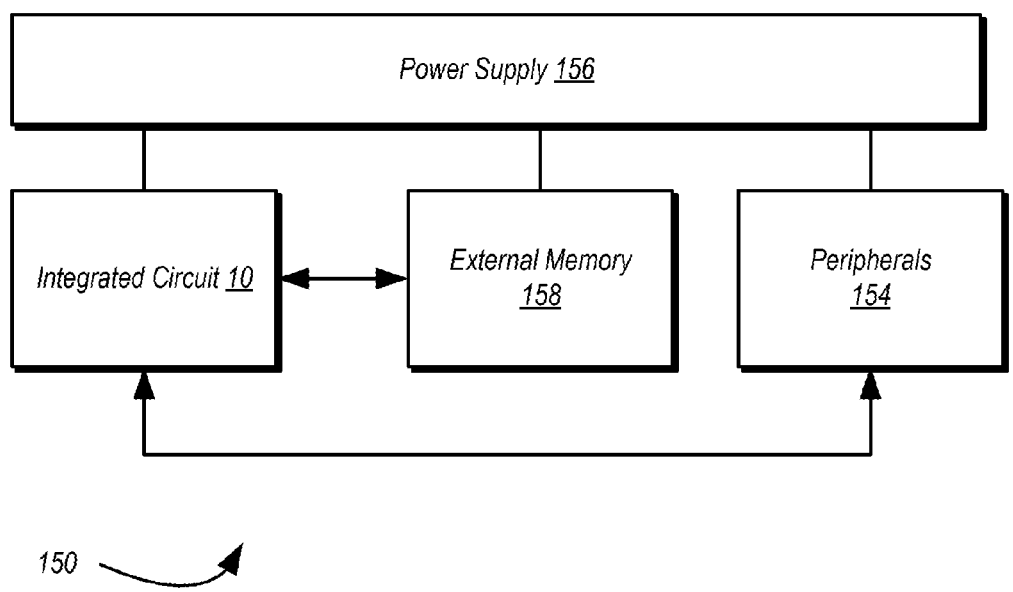
FIG. 6 is a block diagram of one embodiment of an exemplary system.

Turning next to FIG. 6, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a functional circuit block;
a static random access memory (SRAM) coupled to the functional circuit block, wherein the SRAM includes a plurality of storage locations organized into a plurality of rows and a plurality of columns; and
a plurality of level shifter circuits including:
a first level shifter configured to disable a precharge signal received by the SRAM responsive to assertion of an initialization signal by the functional circuit block; and
a second level shifter configured to force assertion of a write enable signal received by the SRAM responsive to assertion of the initialization signal;
wherein the SRAM includes a decoder configured to force assertion of each of a plurality of column select signals received by the SRAM responsive to assertion of the initialization signal.

2. The integrated circuit as recited in claim 1, wherein each of the plurality of level shifters includes:
an output driver circuit;
an initialization input configured to receive the initialization signal, wherein the output driver circuit is configured to drive an output node of the level shifter to a first logic level responsive to assertion of the initialization signal.

3. The integrated circuit as recited in claim 2, wherein each of the plurality of level shifters further includes:
an isolation input configured to receive an isolation signal, wherein the output driver circuit is configured to drive the output node of the level shifter to a second logic level drive responsive to assertion of the isolation signal while the initialization signal is de-asserted; and
a data input configured to receive a data signal, wherein the output driver circuit is configured to drive the output node of the level shifter to a logic level equivalent to that of a signal received on the third input when both the isolation and initialization signals are de-asserted.

4. The integrated circuit as recited in claim 3, wherein each of the plurality of level shifters further includes:
a first pull-up circuit coupled between a first supply voltage node and a complementary output node;
a first pull-down circuit coupled to the complementary output node;
a second pull-up circuit coupled between the first supply voltage node and the output node; and
a second pull-down circuit coupled to the output node.

5. The integrated circuit as recited in claim 4, wherein the first pull-up circuit includes a first p-channel metal oxide semiconductor (PMOS) transistor having a respective gate terminal coupled to the output node and a second PMOS transistor having a respective gate terminal coupled to the data input, and wherein the second pull-up circuit includes a third PMOS transistor having a respective gate terminal coupled to the complementary output node and a fourth PMOS transistor having a respective gate terminal coupled to a complementary input node.

6. The integrated circuit as recited in claim 5, further comprising an inverter having a respective input coupled to the input node and a respective output coupled to the complementary input node.

7. The integrated circuit as recited in claim 4, further comprising an isolation transistor, wherein the isolation transistor is an n-channel metal oxide semiconductor (NMOS) transistor coupled between a reference node and each of the first and second pull-down circuits, and wherein a gate terminal of the isolation transistor is coupled to the isolation input.

8. The integrated circuit as recited in claim 7, wherein the isolation transistor is configured to complete a pull-down path for one of the first and second pull-down circuits when the isolation signal is de-asserted.

9. The integrated circuit as recited in claim 1, further comprising a plurality of bit line hold circuits each coupled to a plurality of bit cells in a corresponding one of the plurality of columns, wherein each of the bit line hold circuit includes:
a pair of cross-coupled p-channel metal oxide semiconductor (PMOS) transistors, wherein a first one of the cross-coupled PMOS transistors is coupled between an SRAM supply voltage node and a first bit line and a second one of the cross-coupled PMOS transistors is coupled between the supply voltage node and a second bit line, wherein the cross-coupled PMOS transistors are configured to hold data values on their respectively coupled bit lines during an initialization of the SRAM.

10. The integrated circuit as recited in claim 9, wherein each of the bit line hold circuit further includes:
a first pair of series-coupled n-channel metal oxide semiconductor (NMOS) transistors coupled between the first bit line and the reference node, the first pair including first and second NMOS transistors;
a second pair of series-coupled NMOS transistors coupled between the second bit line and the reference node, the second pair including third and fourth transistors;
wherein the first and third transistors are coupled to a write enable input, wherein the second transistor is coupled to a data input, and wherein the fourth transistor is coupled to a complementary data input.

11. A method comprising:
a functional circuit block asserting an initialization signal;
forcing assertion of a write enable signal and a plurality of bank select signals provided to a static random access memory (SRAM) responsive to assertion of the initialization signal, the SRAM having a plurality of rows and a plurality of banks;
inhibiting a precharge signal from being provided to the SRAM responsive to assertion of the initialization signal;
concurrently writing initialization data to each address in a first one of the plurality of rows; and repeating said concurrently writing of initialization data for each address of each remaining one of the plurality of rows.

12. The method as recited in claim 11, wherein each of the plurality of rows of the SRAM extends across the plurality of banks, wherein the method further comprises concurrently writing initialization data within a given row for each of the plurality of banks.

13. The method as recited in claim 11, further comprising:
a first one of a plurality of level shifters forcing assertion of the write enable signal responsive to receiving the initialization signal; and
a second one of the plurality of level shifters forcing the precharge clock to remain at a predetermined level responsive to receiving the initialization signal.

14. The method as recited in claim 13, further comprising a decoder associated with the SRAM forcing assertion of bank select signals for each of the plurality of banks responsive to receiving the initialization signal.

15. The method as recited in claim 11 further comprising:
driving initialization data one each of a plurality of bit line pairs; and
holding the initialization data on the bit line pairs using a pair of cross-coupled p-channel metal oxide semiconductor transistors.

16. An integrated circuit comprising:
a static random access memory (SRAM) having a plurality of rows and a plurality of banks, wherein each of the plurality of rows extends across the plurality of banks;
a decoder circuit configured to, responsive to receiving an initialization signal from a functional circuit block of the integrated circuit, cause assertion of each of a plurality of bank select signals associated with respective ones of the plurality of banks and further cause assertion of a write enable signal;
wherein the functional circuit block is configured to perform an initialization of the SRAM by holding the initialization signal asserted and concurrently writing initialization data into a given row across each of the plurality of banks of the SRAM and further configured to repeat concurrently writing initialization data into each additional row across each of the plurality of banks of the SRAM until initialization data has been written into each of the plurality of rows.

17. The integrated circuit as recited in claim 16, further comprising a plurality of level shifters, wherein a first one of the plurality of level shifters is configured to hold a precharge clock at a predetermined level responsive to assertion of the initialization signal.

18. The integrated circuit as recited in claim 17, wherein each of the level shifters includes:
an output driver circuit;
an initialization input configured to receive the initialization signal, wherein the output driver circuit is configured to drive an output node of the level shifter to a first logic level responsive to assertion of the initialization signal;
an isolation input configured to receive an isolation signal, wherein the output driver circuit is configured to drive the output node of the level shifter to a second logic level when the isolation signal is asserted and the initialization signal is de-asserted.

19. The integrated circuit as recited in claim 18, further comprising a data input, wherein the level shifter is configured to provide an output signal on the output node at a logic level equivalent to an input signal received on the data input when both the initialization and isolation signals are de-asserted.

20. The integrated circuit as recited in claim 16, further comprising a plurality of bit line hold circuits each coupled to a plurality of bit cells in a corresponding one of the plurality of banks, wherein each of the plurality of bit cells is in a different one of the plurality of rows with respect to the other ones of the plurality of bit cells, wherein each of the bit line hold circuit includes:
a pair of cross-coupled p-channel metal oxide semiconductor (PMOS) transistors, wherein a first one of the cross-coupled PMOS transistors is coupled between an SRAM supply voltage node and a first bit line and a second one of the cross-coupled PMOS transistors is coupled between the supply voltage node and a second bit line, wherein the cross-coupled PMOS transistors are configured to hold data values on their respectively coupled bit lines during an initialization of the SRAM.

* * * * *

UNITED STATES PATENT AND TRADEMARK OFFICE
CERTIFICATE OF CORRECTION

| | | |
|---|---|---|
| PATENT NO. | : 9,286,971 B1 | Page 1 of 1 |
| APPLICATION NO. | : 14/482613 | |
| DATED | : March 15, 2016 | |
| INVENTOR(S) | : Greg M. Hess et al. | |

It is certified that error appears in the above-identified patent and that said Letters Patent is hereby corrected as shown below:

In the Claims:

Claim 3, Column 7, Line 62, please delete "on the third input"

Claim 10, Column 8, Line 47, please delete "the reference node" and substitute -- a reference node --

Claim 13, Column 9, Lines 13-14, please delete "the precharge clock" and substitute -- the precharge signal --

Signed and Sealed this
Fifth Day of July, 2016

Michelle K. Lee
*Director of the United States Patent and Trademark Office*